United States Patent
Lavery et al.

(10) Patent No.: US 7,423,565 B2
(45) Date of Patent: Sep. 9, 2008

(54) APPARATUS AND METHOD FOR COMPARISON OF A PLURALITY OF ANALOG SIGNALS WITH SELECTED SIGNALS

(75) Inventors: Kevin P. Lavery, Sugar Land, TX (US); Sunil S. Oak, Sugar Land, TX (US)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 11/507,323

(22) Filed: Aug. 21, 2006

(65) Prior Publication Data

US 2007/0257829 A1    Nov. 8, 2007

Related U.S. Application Data

(60) Provisional application No. 60/798,593, filed on May 8, 2006.

(51) Int. Cl.
 *H03M 1/12* (2006.01)
(52) U.S. Cl. .................. 341/141; 341/155; 710/262
(58) Field of Classification Search .......... 341/155, 341/141; 710/262, 266
See application file for complete search history.

(56) References Cited

U.S. PATENT DOCUMENTS

| | | | | |
|---|---|---|---|---|
| 5,455,774 | A | * | 10/1995 | Khawand et al. .......... 702/64 |
| 6,349,246 | B1 | * | 2/2002 | Smith et al. .............. 701/1 |
| 2002/0000928 | A1 | * | 1/2002 | Heyl et al. ............... 341/155 |
| 2002/0121998 | A1 | * | 9/2002 | Yamazaki ................ 341/155 |
| 2004/0160435 | A1 | * | 8/2004 | Cui et al. ................. 345/211 |

FOREIGN PATENT DOCUMENTS

JP    2001350594 A  * 12/2001

* cited by examiner

*Primary Examiner*—Howard Williams
(74) *Attorney, Agent, or Firm*—Frederick J. Telecky, Jr.; Wade J. Brady, III

(57) ABSTRACT

In response to a selected analog applied to the input terminal of an analog-to-digital converter, the digitized output signal is stored in a buffer/register. In making a comparison with a predetermined value, a second buffer/register stores either a preselected value or a second digitized signal. A comparator is coupled to the first and the second buffer/register to provide the result of a comparison. In this manner, the central processing unit is not involved in the comparison testing procedure.

11 Claims, 3 Drawing Sheets

APPARATUS AND METHOD FOR COMPARISON OF A PLURALITY OF ANALOG SIGNALS WITH SELECTED SIGNALS

This application claims the benefit of Provisional Application Ser. No. 60/798,593, entitled "Programmable Trigger Level for Analog to Digital Converter", filed on May 8, 2006.

BACKGROUND OF THE INVENTION

1. Field of the Invention

This invention relates generally to analog-to-digital converts and, more particularly, to using an analog-to-digital converter in a programmable trigger level comparison configuration.

2. Background of the Invention

In many important applications, the level of a signal should be constrained by predetermined values. For example, when the oil pressure in a motor rises above a certain level, a response is called for. That response can be a warning signal to the user or can be a more direct response involving the motor itself.

Referring to FIG. 1, the use of an analog-to-digital converter 15 to provide an activity upon a predetermined comparison with a voltage level is shown. A series of signals are applied to input terminals 11A-11N of a multiplexer 12. A sequence/control unit 14 selects the input terminal 11A-11N to be applied to an analog-to-digital converter 15. The output signal of the analog-to-digital converter 15 is applied to switch 16 under the control of the sequence/control unit 14. The configuration of the switch 16 determines into which of the buffer/registers 17A-17M the output signal of the analog-to-digital converter 15 is stored. In response to a signal from the sequence/control unit 14, an interrupt is provided to the central processing unit 18. In response to this interrupt signal, the central processing unit 18 retrieves the contents of a preselected one of the buffer/registers 17A-17M and compares the stored value in the buffer/register with a predetermined value stored in the central processing unit 18. When the comparison is positive, the central processing unit 18 generates an interrupt signal to respond to the identified condition and then continues the execution of the programmed procedures.

The foregoing procedure has several features that affect the efficiency of the program execution of the central processing unit 18. In particular, the necessity for interrupting the executing program of the central processing to determine whether an interrupt signal should be generated is typically wasted time when the condition to generate and interrupt signal are not present.

A need has therefore been felt for apparatus and an associated method having the feature of a comparison of a digitized signal with a predetermined value. It would be yet another feature of the apparatus and associated method for comparing a digitized signal with a predetermined value without the intervention of the central processing unit. It is yet another feature of the apparatus and associated method to generate an interrupt signal without disrupting the operation of the central processing unit.

SUMMARY OF THE INVENTION

The foregoing and other features are accomplished, according the present invention, by providing a selectable input signal for an analog-to-digital converter. The digitized output signal of the analog-to-digital converter is stored in one of a second plurality of buffer/registers. Associated with each of the second plurality of buffer/registers is an associated buffer/register. The associated buffer/register stores a value against which the contents of the buffer/register is to be compared. According to a first embodiment of the invention an associated buffer/register stores a preslected value. According to a second embodiment, the associated buffer/register stores a digitized signal that has been applied to the analog-to-digital converter, the input signal having been selected by a sequence control unit. The contents of the buffer/register and the associated buffer register are applied to a comparator unit. The result of the comparison, when the comparison provides an expected result, is to generate an interrupt signal, the interrupt signal being applied to the central processing unit in order to respond to the expected condition.

Other features and advantages of the present invention will be more clearly understood upon reading of the following description and the accompanying drawings and the claims.

DETAILED DESCRIPTION OF THE FIGURES

Figure 1:
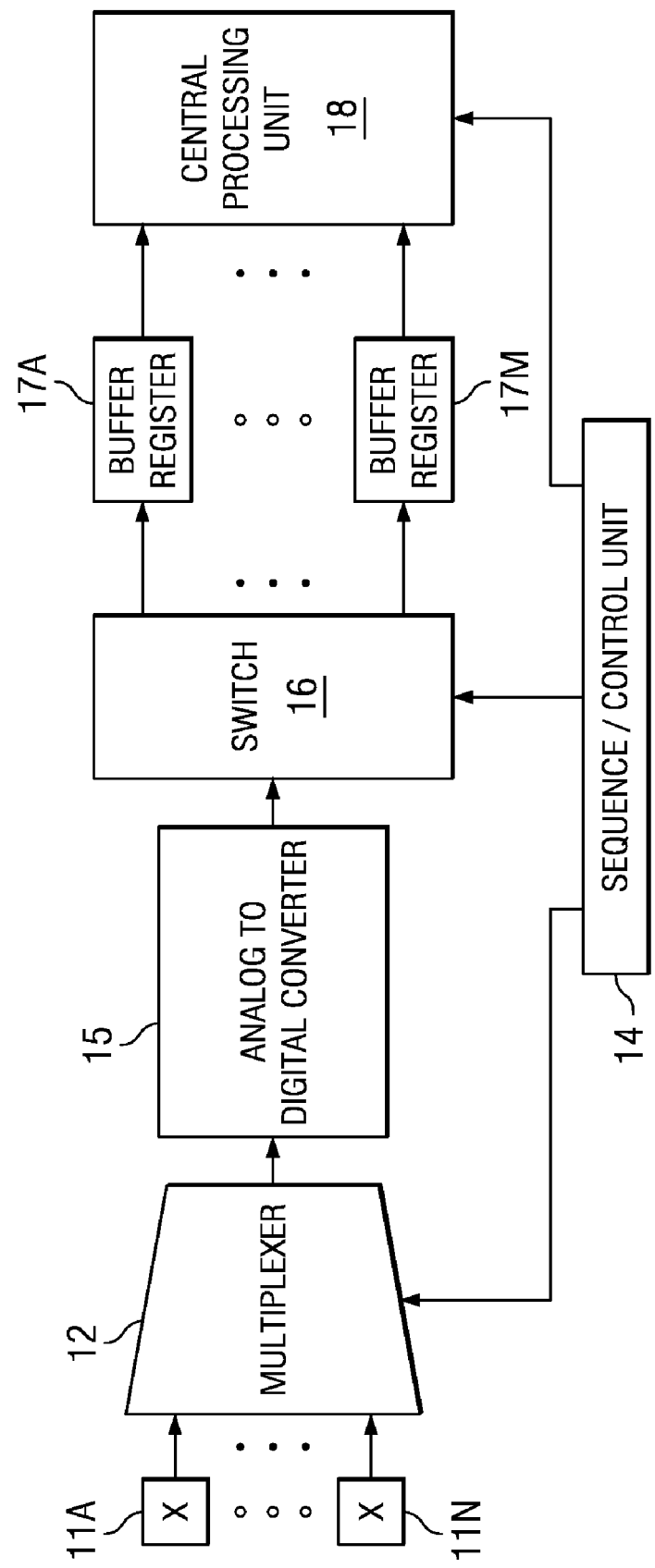
FIG. 1 illustrates the apparatus for determining the results of a comparison between a digitized signal and a preselected signal according to the prior art.

FIG. 1 has been discussed with respect to the related art.

Figure 2:
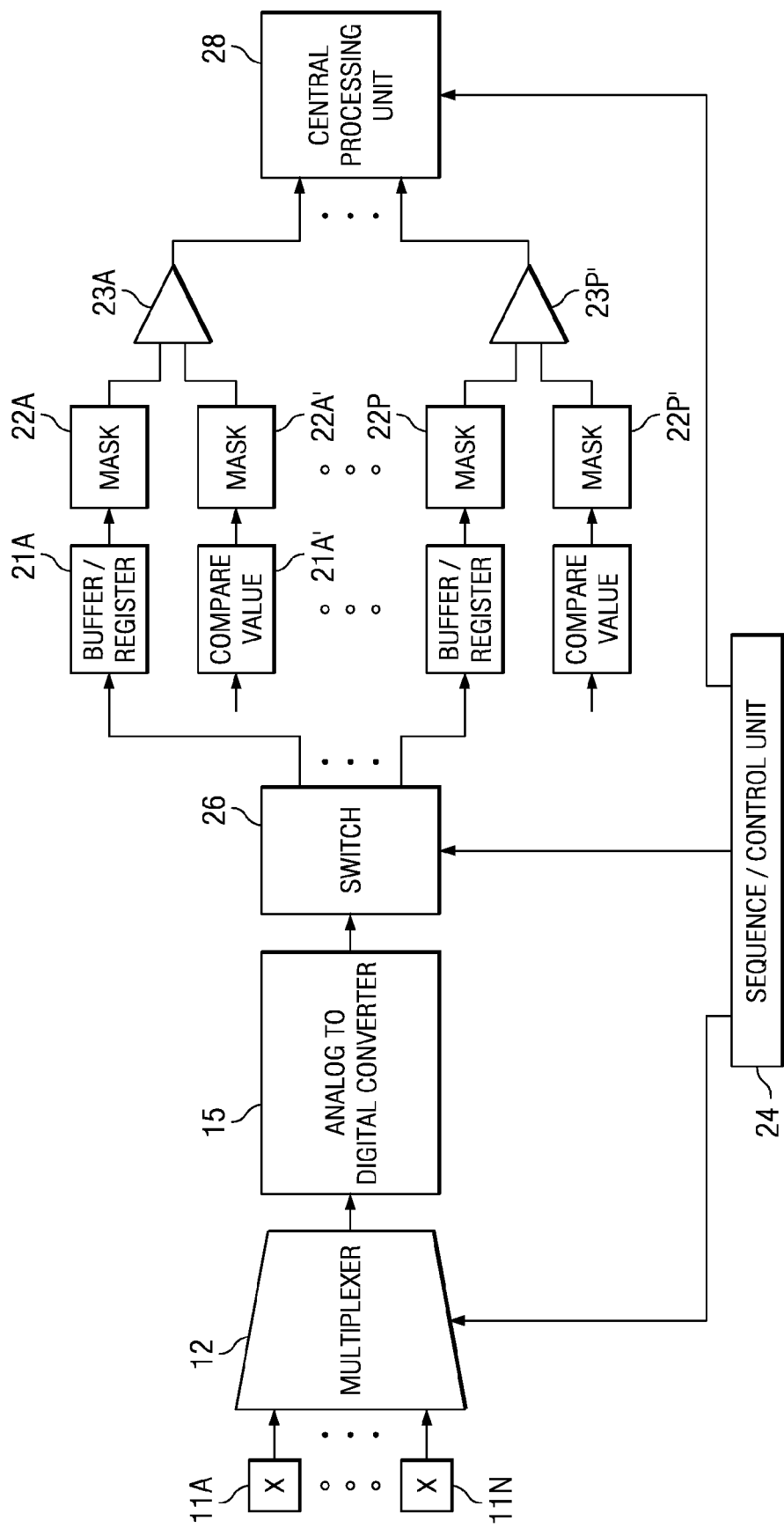
FIG. 2 illustrates the apparatus for comparing a digitized signal with a preselected digital value without requiring a central processing unit according to the present invention.

Referring next to FIG. 2, a block diagram of the first embodiment of the present invention is shown. Signals are applied to input terminals 11A-11N that are coupled to the input terminals of multiplexer 12. Control signals from sequence/control unit 24 determine the input signal applied to analog-to-digital converter 15. The output terminal of the analog-to-digital converter 15 is applied the digitized output signal to switch 26. In response to control signals from sequence/control unit 24, the switch directs the digitized signal from the analog-to-digital converter 15 to one of the buffer/registers 21A-21P for storage. Associated with each buffer/register 21A-21P is an associated compare/value register 21A'-21P'. The compare/value registers 21A'-21P' store values that have been determined by the user. Each buffer/register 21A-21P is coupled through a mask 22A-22P to a first input terminal of comparators 23A-23P. Each compare/value register 21A'-21P' is coupled through a mask 22A'-22P' to a second input terminal of comparators 23A-23P. The output terminals of comparators 23A-23P are coupled to the central processing unit 28. The output signals of the comparators apply interrupt signals to the central processing unit 28. The values in the compare value registers can be hardwired, can be entered by the central processing unit, entered by the user, or some other storage method using available apparatus.

Figure 3:
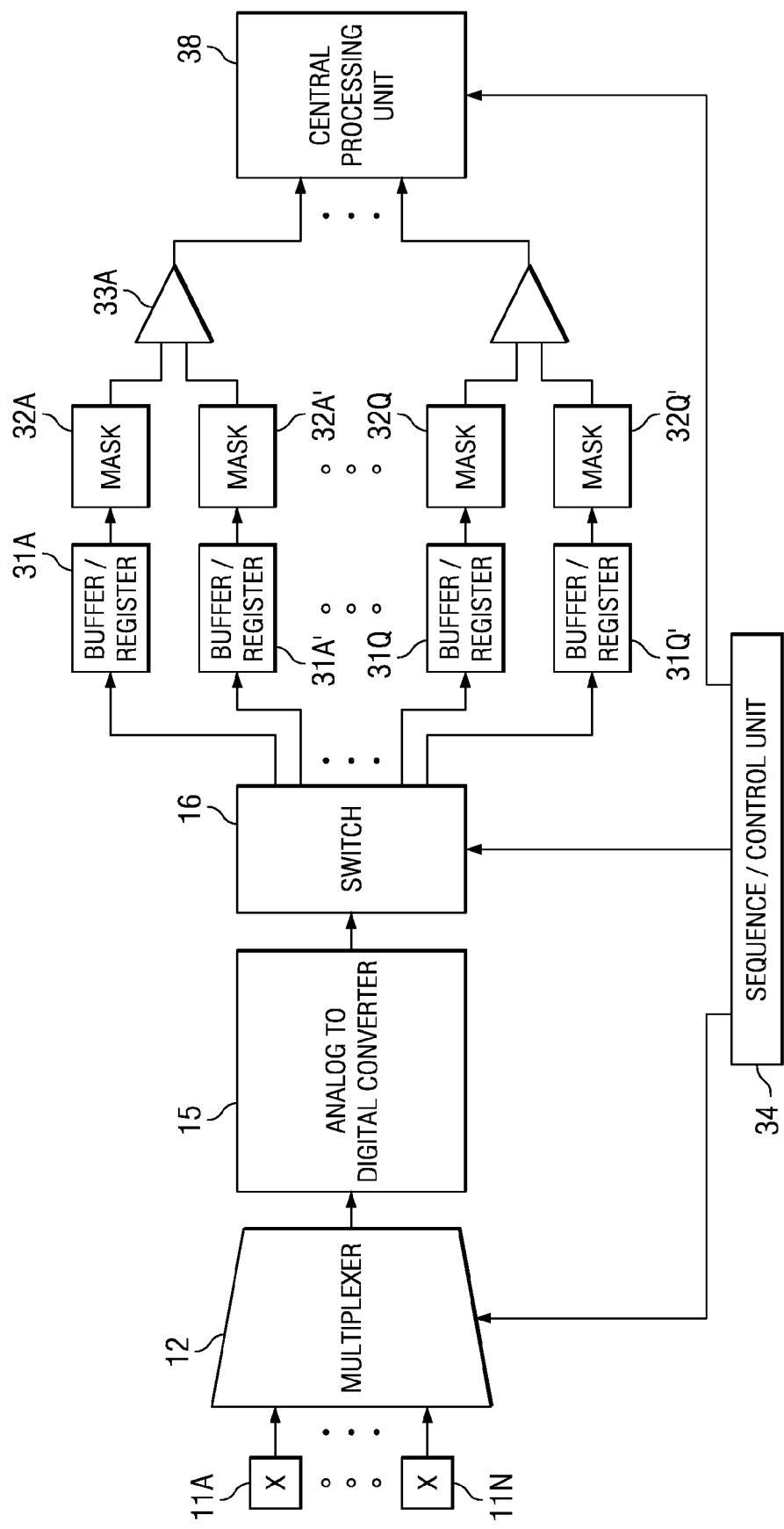
FIG. 3 illustrates apparatus for comparing two digitized signals according to the present invention.

Referring next to FIG. 3, a second embodiment of the invention is illustrated. In this embodiment input signals are applied to multiplexer 12. A sequence/control unit 34 applies signals to the control terminals of a multiplexer 12. These control signals determine the multiplexer 12 input terminal that is coupled to the multiplexer 12 output terminal. The multiplexer 12 output terminal is applied to switch 16. The sequence/control unit 34 determines to which buffer/register unit 31A-31Q or to which buffer/register 32A"-32Q' the output terminal of switch 16 is coupled. Each buffer/register 31A-31Q has an associated buffer/register 31A'-31Q' associated therewith. Each buffer register 31A-31Q is coupled through a mask 32A-32Q to a first input terminal of a comparator 33A-33Q, while the associated buffer register 33A'-33Q' is coupled through mask 32A'-32Q' to a second terminal of comparator 33A-33Q. The output signals from comparators 33A-33Q are applied to the central processing unit 38. The output signals from the comparators 33A-33Q provide interrupt signals to the central processing unit and require a response.

In FIG. 2 and FIG. 3, the comparators are illustrated as comparing two input signals. As will be clear to those skilled in the art, each buffer/register can apply a plurality of signals (over a plurality of conducting leads) to the coupled comparator. The comparators compare related signals on a signal-by-signal basis. Each of the two groups of unmasked leads coupled to a comparator must provide coincident signals in order to generate an interrupt signal.

OPERATION OF THE PREFERRED EMBODIMENT

The present invention improves the processing capability in the following manner. In the present invention, an interrupt signal is provided only when the appropriate condition is detected. In the prior art, the central processing unit must at least periodically test the contents of the buffer/register to see if the condition(s) for generating an interrupt signal is present. Thus, testing will generate only a limited number of interrupt signals relative to the time an interrupt signal is generated, In the present invention, the interrupt signal is generated when the condition are appropriate and no signal is generated until the conditions are suitable. Thus, the impact on the central processing is limited to responding to an interrupt signal rather than determining if the conditions are appropriate for an interrupt signal.

In the embodiment illustrated in FIG. 2, a preselected signal is compared to a predetermined value. In the embodiment of the invention illustrated in FIG. 3, a preselected signal is compared to a second preselected signal. As will be clear, both embodiments can be combined in a single system, the burden of the implementation falling on the sequence/control unit.

While the invention has been described with respect to the embodiments set forth above, the invention is not necessarily limited to these embodiments. Accordingly, other embodiments, variations, and improvements not described herein are not necessarily excluded from the scope of the invention, the scope of the invention being defined by the following claims.

What is claimed is:

1. Apparatus for comparing a digitized analog signal with a digital signal, the comparison of the digitized analog signal and the digital signal being applied to a processing unit, the apparatus comprising:
   a sequential control unit, the sequential control unit supplying control signals;
   a multiplexer having a plurality of analog signals applied to input terminals thereof, the control signals selecting the analog signal to be digitized;
   an analog-to-digital converter, the analog-to-digital converter digitizing the selected analog signal;
   a plurality of buffer register pairs;
   a switch unit responsive to the control unit for selecting one of the buffer register pairs;
   a first buffer register of a selected buffer register pair coupled to the switch unit, the first buffer register storing the digitized signal;
   a second buffer register of the selected buffer register pair being coupled to an output of the switch unit storing the digital signal that has been digitized by the analog-to-digital converter; and
   a comparator having first input terminal coupled to the first buffer register, the comparator having a second input terminal coupled to the second buffer register, the output terminal of the comparator providing a comparison between the digitized and digital signals to the processing unit in response to the control signals.

2. The apparatus as recited in claim 1 wherein the output signal of the comparator is an interrupt signal.

3. The apparatus as recited in claim 1 wherein the digital signal is a digitized analog signal applied to the multiplexer.

4. The apparatus as recited in claim 1 further comprising:
   a first mask coupled between the first buffer register and the first input terminal of the comparator; and
   a second mask coupled between the second buffer/register and the second input terminal of the comparator.

5. A method of providing a signal applying a comparison signal defining a relationship between a first analog signal and a second signal to a processing unit, the method comprising:
   selecting the first analog signal and the second signal from a plurality of analog signals with a multiplexer;
   digitizing the first signal and the second signal in an analog-to-digital converter;
   storing the digitized first signal in a selected first buffer register of a plurality of buffer register pairs selected by a switch unit;
   storing a digitized second signal in a second buffer register of the selected buffer register pair selected by the switch unit;
   comparing the first signal and the second signal with a comparator; applying the output signal of the comparator to the processing unit; and
   coordinating the selecting the first analog signal, storing the digitized first signal and applying the output signal with control signals from a sequential control unit.

6. The method as recited in claim 5 further comprising masking at least one of the digitized first signal and the digitized second signal stored in the buffer registers.

7. The method as recited in claim 5 further comprising generating an interrupt signal determined by the comparing of the digitized first and the digitized second signals and applying the interrupt signal to the processing unit.

8. Apparatus for comparing a first analog signal and a second signal and providing the results to a processing unit, the apparatus comprising:
   a multiplexer having a plurality of analog signals applied to input terminals thereof, the multiplexer responsive to control signals for selecting a selected analog signal;
   an analog-to-digital converter, the analog-to-digital converter converting the selected analog input signal to one of a digitized first signal and a digitized second signal;
   at least one buffer register pair;
   a switch unit coupled between an output terminal of the analog-to-digital converter and a first buffer register and a second buffer register of a buffer register pair in response to control signals;
   a comparator coupled to the first buffer register and to the second buffer register, the comparator generating a comparison signal, the comparison signal being applied to a processing unit in response to control signals; and a control unit, the control unit selecting the multiplexer input signal, selecting the buffer register pair, and controlling the application of the comparison signal to the processing unit.

9. The apparatus as recited in claim 8 wherein the output signal of a comparator is an interrupt signal.

10. The apparatus as recited in claim 8, further comprising a plurality of buffer register pairs, the control signals selecting a buffer register pair.

11. The apparatus as recited in claim 8 further comprising mask units coupled between the buffer register units and the comparator.

* * * * *